US012643316B2

(12) United States Patent
Kim et al.

(10) Patent No.: US 12,643,316 B2
(45) Date of Patent: Jun. 2, 2026

(54) WINDOW MODULE AND METHOD OF MANUFACTURING DISPLAY DEVICE

(71) Applicant: Samsung Display Co., LTD., Yongin-si (KR)

(72) Inventors: Boyun Kim, Cheonan-si (KR); Ji Hyuk Im, Yongin-si (KR); Sungwon Cho, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 18/641,777

(22) Filed: Apr. 22, 2024

(65) Prior Publication Data

US 2024/0276758 A1 Aug. 15, 2024

Related U.S. Application Data

(62) Division of application No. 17/229,204, filed on Apr. 13, 2021, now Pat. No. 11,985,843.

(30) Foreign Application Priority Data

Aug. 19, 2020 (KR) ......................... 10-2020-0104221

(51) Int. Cl.
B32B 38/10 (2006.01)
B32B 7/06 (2019.01)
(Continued)

(52) U.S. Cl.
CPC .............. B32B 27/281 (2013.01); B32B 7/06 (2013.01); B32B 7/12 (2013.01); B32B 37/12 (2013.01);
(Continued)

(58) Field of Classification Search
CPC .. B32B 7/12; B32B 37/12; B32B 7/06; B32B 2457/20; B32B 2307/748;
(Continued)

(56) References Cited

U.S. PATENT DOCUMENTS 10,688,712 B2 * 6/2020 Mason ................... B29C 63/02
11,150,754 B2 10/2021 Lee et al.
(Continued)

FOREIGN PATENT DOCUMENTS

CN 105745291 A 7/2016
CN 109493722 A 3/2019
(Continued)

OTHER PUBLICATIONS

Korean Office Action with English translation for Korean Patent Application No. 10-2020-0104221, dated Oct. 16, 2024.
(Continued)

*Primary Examiner* — Scott W Dodds
(74) *Attorney, Agent, or Firm* — Sughrue Mion, PLLC

(57) ABSTRACT

A window module includes a window, a first protective film disposed on a first surface of the window, and a second protective film disposed on a second surface opposite to the first surface of the window. A first release force of the first protective film with respect to the window is greater than a second release force of the second protective film with respect to the window.

8 Claims, 9 Drawing Sheets

(51) Int. Cl.

| | |
|---|---|
| *B32B 7/12* | (2006.01) |
| *B32B 27/28* | (2006.01) |
| *B32B 37/12* | (2006.01) |
| *C09J 7/22* | (2018.01) |
| *C09J 7/40* | (2018.01) |
| *H10K 59/80* | (2023.01) |
| *B32B 17/10* | (2006.01) |
| *B32B 37/26* | (2006.01) |
| *H10K 59/12* | (2023.01) |
| *H10K 102/00* | (2023.01) |

(52) U.S. Cl.
CPC ................ *B32B 38/10* (2013.01); *C09J 7/22* (2018.01); *C09J 7/40* (2018.01); *H10K 59/87* (2023.02); *B32B 17/10* (2013.01); *B32B 2037/268* (2013.01); *B32B 2307/412* (2013.01); *B32B 2307/748* (2013.01); *B32B 2457/20* (2013.01); *C09J 2301/124* (2020.08); *C09J 2301/1242* (2020.08); *H10K 59/12* (2023.02); *H10K 2102/311* (2023.02); *Y10T 428/14* (2015.01); *Y10T 428/28* (2015.01)

(58) Field of Classification Search
CPC .............. B32B 2037/268; B32B 38/10; B32B 2307/412; C09J 2301/1242
See application file for complete search history.

(56) References Cited

U.S. PATENT DOCUMENTS

| | | | |
|---|---|---|---|
| 2010/0119803 A1 | 5/2010 | Kosaka et al. | |
| 2011/0279383 A1 | 11/2011 | Wilson et al. | |
| 2013/0309433 A1* | 11/2013 | Hsu | C09J 7/38 |
| | | | 428/38 |
| 2016/0002501 A1* | 1/2016 | Niiyama | B32B 7/06 |
| | | | 428/354 |
| 2019/0077121 A1 | 3/2019 | Lee et al. | |
| 2020/0307155 A1* | 10/2020 | Yasui | B32B 17/10 |

FOREIGN PATENT DOCUMENTS

| | | | | |
|---|---|---|---|---|
| KR | 10-2008-011537 | 2/2008 | | |
| KR | 10-2015-0053198 | 5/2015 | | |
| KR | 10-2018-0096448 | 8/2018 | | |
| KR | 10-2038740 | 10/2019 | | |
| KR | 10-2040299 | 11/2019 | | |
| KR | 10-2019-0140129 | 12/2019 | | |
| KR | 10-2020-0041042 | 4/2020 | | |
| KR | 10-2020-0072643 | 6/2020 | | |
| WO | 2010/073993 | 7/2010 | | |
| WO | 2015/068926 | 5/2015 | | |
| WO | WO-2017216886 A1 * | 12/2017 | ............ | B32B 17/10 |
| WO | 2018/155819 A1 | 8/2018 | | |

OTHER PUBLICATIONS

Office Action dated Jan. 21, 2026, issued by Chinese Patent Office in Chinese Patent Application No. 202110879027.2.

* cited by examiner

WINDOW MODULE AND METHOD OF MANUFACTURING DISPLAY DEVICE

CROSS-REFERENCE TO RELATED APPLICATION(S)

This is a divisional application of U.S. patent application Ser. No. 17/229,204 filed Apr. 13, 2021, the disclosure of which is incorporated herein by reference in its entirety. U.S. patent application Ser. No. 17/229,204 claims priority to and the benefit of Korean Patent Application No. 10-2020-0104221, filed in the Korean Intellectual Property Office on Aug. 19, 2020, the entire contents of which are incorporated herein by reference.

BACKGROUND

1. Technical Field

The disclosure generally relates to a window module, and more specifically, to the window module and a method of manufacturing a display device using the window module.

2. Description of the Related Art

The display device includes a lower structure and a window disposed on the lower structure. The lower structure includes pixels and a driving part which provides driving signals to the pixels. The driving part includes a circuit board, a driving circuit, and a driving line. The window may protect the lower structure from external forces and impurities and may be transported in a form of a window module including the window.

In recent years, a flexible display device has been developed, and accordingly, a window having a flexible characteristic is being developed. As the window has a flexible characteristic, the window is easily damaged.

The above information disclosed in this Background section is only for understanding of the background of the disclosure, and, therefore, it may contain information that does not constitute prior art.

SUMMARY

Some embodiments provide a window module to reliably transport windows and to increase a process yield of display device.

Some embodiments provide a method of manufacturing a display device using the window module.

A window module according to an embodiment may include a window, a first protective film disposed on a first surface of the window, and a second protective film disposed on a second surface opposite to the first surface of the window. A first release force of the first protective film with respect to the window may be greater than a second release force of the second protective film with respect to the window.

According to an embodiment, the first release force may be greater than about 10 gf/in and less than about 30 gf/in.

According to an embodiment, the second release force may be greater than about 1 gf/in and less than about 6 gf/in.

According to an embodiment, a first shortest distance from a first end of the window to a first end of the first protective film may be less than a second shortest distance from a second end of the window to a second end of the first protective film, in a plan view.

According to an embodiment, the window may include a circuit correspondence region including the first end of the window, and a display correspondence region adjacent to the circuit correspondence region and including the second end of the window.

According to an embodiment, the first shortest distance may be greater than about 0.5 mm and less than about 1 mm, and the second shortest distance may be greater than about 1 mm and less than about 2 mm.

According to an embodiment, a third shortest distance from the first end of the first protective film to an end of the second protective film may be greater than the first shortest distance and less than the second shortest distance, in a plan view.

According to an embodiment, the third shortest distance may be greater than about 3 mm and less than about 13 mm.

According to an embodiment, the first protective film may have a first thickness, the second protective film may have a second thickness, and the first may be greater than the second thickness.

According to an embodiment, the first thickness may be greater than about 100 μm and less than about 150 μm.

According to an embodiment, the second thickness may be greater than about 50 μm and less than about 100 μm.

According to an embodiment, the second protective film may have a rectangular shape with rounded corners.

According to an embodiment, a radius of curvature each of the rounded corners of the rectangular shape may be greater than about 2 mm and less than about 10 mm.

According to an embodiment, the window may include a first film and a first adhesive layer, and the first adhesive layer may be laminated to the first film and contacts the second protective film. The first protective film may include a second film and a second adhesive layer, and the second adhesive layer may be disposed between the first film and the second film.

According to an embodiment, the window may include a light blocking pattern disposed between the first film and the first adhesive layer, and a hard coating layer disposed on the first film.

A window module according to another embodiment may include a window, a first protective film disposed on a first surface of the window and having a first thickness, and a second protective film disposed on a second surface opposite to the first surface of the window and having a second thickness less than the first thickness. A first release force of the first protective film with respect to the window may be greater than a second release force of the second protective film with respect to the window, a first shortest distance from a first end of the window to a first end of the first protective film may be less than a second shortest distance from a second end of the window to a second end of the first protective film, in a plan view, and the second protective film may have a rectangular shape with rounded corners.

According to an embodiment, a third shortest distance from the first end of the window to an end of the second protective film may be greater than the first shortest distance and less than the second shortest distance, in a plan view.

According to an embodiment, the window may include a first film and a first adhesive layer, and the first adhesive layer may be laminated to the first film and contacts the second protective film. The first protective film may include a second film and a second adhesive layer, and the second adhesive layer may be disposed between the first film and the second film.

A method of manufacturing a display device according to an embodiment may include preparing a window module including a window, a first protective film disposed on a first surface of the window, and a second protective film disposed on a second surface opposite to the first surface of the window, removing the second protective film from the window, arranging a lower structure on the second surface of the window, and removing the first protective film form the window. A first release force of the first protective film with respect to the window may be greater than a second release force of the second protective film with respect to the window.

According to an embodiment, the first release force may be greater than about 10 gf/in and less than about 30 gf/in, and the second release force is greater than about 1 gf/in and less than about 6 gf/in.

A window module according to embodiments of the disclosure may include a window, a first protective film disposed on the window, and a second protective film disposed under the window. A first release force of the first protective film with respect to the window may be greater than a second release force of the second protective film with respect to the window. A first shortest distance from one end of the window to the first protective film may be less than a second shortest distance from the other end of the window to the first protective film, in a plan view. A first thickness of the first protective film may be greater than a second thickness of the second protective film. The second protective film may have a rectangular shape with rounded corners. Accordingly, bubbles may not be generated while the first and second protective films are removed from the window, the second protective film may be easily removed from the window, defects in which a surface of a first film included in the window is pressed by foreign substances may be prevented, the first protective film may not contact the lower structure in the circuit region, and an external force applied to the second protective film may be dispersed. Accordingly, the window may be stably transported, and a process yield of the display device may be increased.

It is to be understood that both the foregoing general description and the following detailed description are explanatory and are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate some embodiments of the disclosure, and together with the description serve to explain the inventive concepts.

DETAILED DESCRIPTION THE EMBODIMENTS

Illustrative, non-limiting embodiments will be more clearly understood from the following detailed description in conjunction with the accompanying drawings.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1:
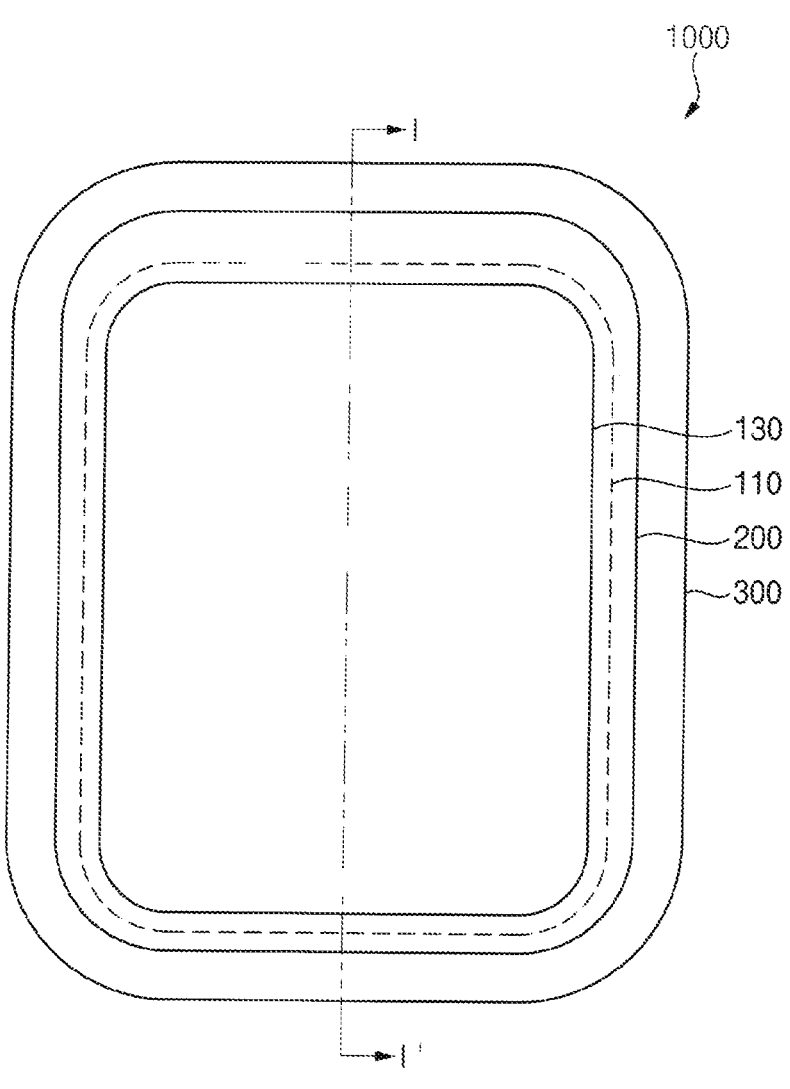
FIG. 1 is a plan view schematically illustrating a window module according to an example embodiment.
Figure 2:
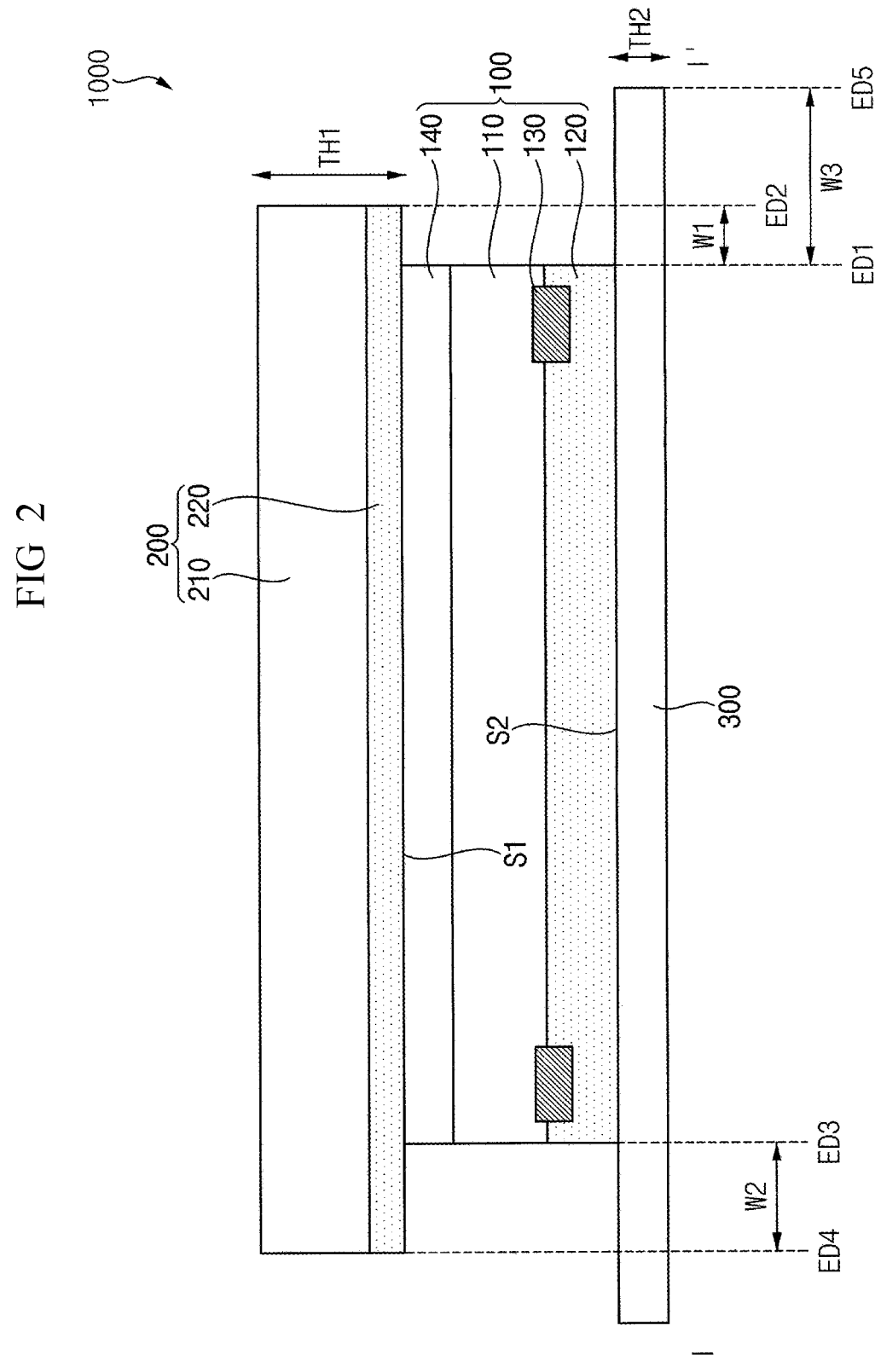
FIG. 2 is a cross-sectional view schematically illustrating the window module of FIG. 1.

FIG. 1 is a schematic plan view illustrating a window module according to an embodiment. FIG. 2 is a schematic cross-sectional view illustrating the window module of FIG. 1. For example, FIG. 2 may be a schematic cross-sectional view taken along line I-I' of FIG. 1.

Referring to FIGS. 1 and 2, a window module 1000 according to an embodiment may include a window 100, a first protective film 200, and a second protective film 300.

The window may include a first film 110, a first adhesive layer 120, and a light blocking pattern 130. The window 100 may further include a functional layer such as a hard coating layer 140 and a low reflection layer. The window 100 may be disposed on a lower structure (e.g., a lower structure 2000 of FIG. 6) and may protect the lower structure from external force.

The first film 110 may include transparent glass or transparent plastic. For example, the first film 110 may include ultra-thin tempered glass (UTG), polyethylene terephthalate (PET), polyimide (PI), polyethersulfone (PS), polyacrylate (PAR), polyetherimide (PEI), polyethylene naphthalate (PEN), polyphenylene sulfide (PPS), polyarylate, polycarbonate (PC), polyarylene ether sulfone, or the like. A thickness of the first film 110 may be greater than about 30 µm and less than about 80 µm. Accordingly, the first film 110 may have a flexible characteristic.

The first adhesive layer 120 may be laminated to the first film 110. For example, the first adhesive layer 120 may be an optically transparent adhesive (OCA), an optically transparent adhesive resin (OCR), a pressure sensitive adhesive (PSA), or the like. The first adhesive layer 120 and the first film 110 may have substantially the same area. Accordingly, the first adhesive layer 120 may attach or bond the second protective film 300 to the first film 110. The first adhesive layer 120 may attach the lower structure 2000 to the first film 110.

The light blocking pattern 130 may be disposed between the first film 110 and the first adhesive layer 120. The light blocking pattern 130 may block light. In an embodiment, the light blocking pattern 130 may be disposed to surround an outer portion of the first film 110. The light blocking pattern 130 may be spaced apart from an edge of the first film 110 by a predetermined distance. For example, the light blocking pattern 130 may be disposed to correspond to a non-emission area of the lower structure 2000. Accordingly, light leakage of the display device (e.g., a display device 3000 of FIG. 9) may be reduced.

The hard coating layer 140 may be disposed on the first film 110. For example, the hard coating layer 140 may include a silicone resin (e.g., silsesquioxane (SSQ)). The hard coating layer 140 may be processed to have anti-fingerprinting function.

The first protective film 200 may be disposed on a first surface S1 of the window 100. For example, the first protective film 200 may have a rectangular shape with rounded corners. The first protective film 200 may protect the window 100 during a transportation process of the window 100. The first protective film 200 may be removed from the window 100 during a manufacturing process of the display device 3000.

The first protective film 200 may include a second film 210 and a second adhesive layer 220.

The second film 210 may include transparent glass or transparent plastic. For example, the second film 210 may include glass, ultra-thin tempered glass (UTG), polyethylene terephthalate (PET), polyimide (PI), polyethersulfone (PS), and polyacrylate (PAR), polyetherimide (PEI), polyethylene naphthalate (PEN), polyphenylene sulfide (PPS), polyarylate, polycarbonate (PC), polyarylene ether sulfone, or the like. The second film 210 may protect the window 100.

The second adhesive layer 220 may be disposed between the hard coating layer 140 and the second film 210. For example, the second adhesive layer 220 may be an optically transparent adhesive (OCA), an optically transparent adhesive resin (OCR), a pressure sensitive adhesive (PSA), or the like. The second adhesive layer 220 and the second film 210 may have substantially the same area. Accordingly, the second adhesive layer 220 may attach the hard coating layer 140 to the second film 210.

The second protective film 300 may be disposed on a second surface S2 opposite to the first surface S1 of the window 100. The second protective film 300 may protect the window 100 during the transportation process of the window 100. The second protective film 300 may be removed from the window 100 during the manufacturing process of the display device 3000.

The second protective film 300 may include transparent glass or transparent plastic. For example, the second protective film 300 may include glass, ultra-thin tempered glass (UTG), polyethylene terephthalate (PET), polyimide (PI), polyethersulfone (PS), polyacrylate (PAR), polyetherimide (PEI), polyethylene naphthalate (PEN), polyphenylene sulfide (PPS), polyarylate, polycarbonate (PC), polyarylene ether sulfone, or the like.

In an embodiment, the second protective film 300 may not include an adhesive layer. For example, the first adhesive layer 120 may attach the second protective film 300 to the first film 110. Accordingly, the release force of the second protective film 300 with respect to the window 100 may be reduced.

The release force may mean a force required to separate a release paper (e.g., the second protective film 300) from an adhesive layer (e.g., the first adhesive layer 120). The release force may be measured by a known method. For example, the release force may be measured at room temperature and may be measured by removing the release paper at a peeling rate (or stripping rate) of about 300 mm/min at about 90°. However, the method of measuring the release force is not limited to the above method.

In an embodiment, a first release force of the first protective film 200 with respect to the window 100 may be greater than a second release force of the second protective film 300 with respect to the window 100. For example, the first release force may be greater than about 10 gf/in and less than about 30 gf/in. The second release force may be greater than about 1 gf/in and less than about 6 gf/in.

The first release force may be greater than the second release force. Accordingly, while the second protective film 300 is removed from the window 100, bubbles may not be generated between the first protective film 200 and the window 100.

The first release force may be less than about 30 gf/in. Accordingly, while the first protective film 200 is removed from the window 100, bubbles may not be generated between the lower structure 2000 and the window 100.

The second release force may be less than about 6 gf/in. Accordingly, the second protective film 300 may be easily removed from the window 100.

In an embodiment, a first thickness TH1 of the first protective film 200 may be greater than a second thickness TH2 of the second protective film 300. For example, the first thickness TH1 may be greater than about 100 μm and less than about 150 μm. The second thickness TH2 may be greater than about 50 μm and less than about 100 μm. As the thickness TH1 of the first protective film 200 is greater than about 100 μm, defects in which a surface of the first film 110 is pressed by foreign substances may be prevented.

Figure 3:
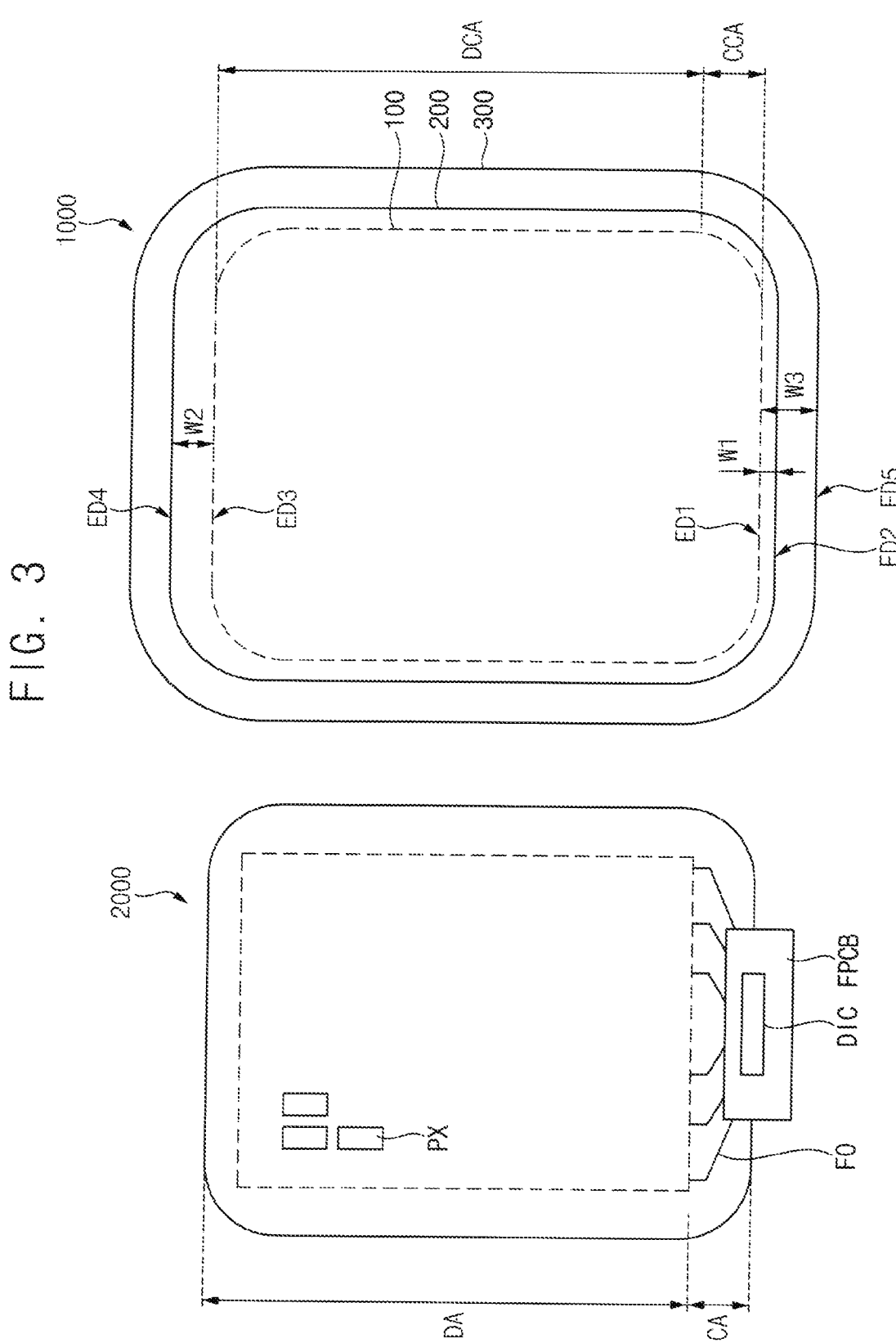
FIG. 3 is a plan view schematically illustrating shortest distances of the window module of FIG. 1.

FIG. 3 is a schematic plan view illustrating shortest distances of the window module of FIG. 1.

Referring to FIGS. 2 and 3, the lower structure 2000 may include a display region DA and a circuit region CA adjacent to the display region DA. Pixels PX may be disposed in the display region DA, and an image may be displayed in the display region DA. A circuit board, a driving circuit, and a driving line may be disposed in the circuit region CA. For example, in the circuit region CA, a flexible printed circuit board FPCB, a data driving circuit DIC disposed on the flexible printed circuit board FPCB, and fan-out lines FO connecting the data driving circuit DIC and the pixels PX may be disposed.

The window 100 may be disposed on the lower structure 2000. The window 100 and the lower structure 2000 may have substantially the same area.

In an embodiment, the window 100 may include a circuit correspondence region CCA and a display correspondence region DCA. The circuit correspondence region CCA may correspond to the circuit region CA, and the display correspondence region DCA may correspond to the display region DA. The circuit correspondence region CCA may include a first end ED1 of the window 100, and the display correspondence region DCA may include a third end ED3 of the window 100.

In an embodiment, the first protective film 200 may include a second end ED2 adjacent to the first end ED1 and a fourth end ED4 adjacent to the third end ED3. The second protective film 300 may include a fifth end ED5 adjacent to the second end ED2.

In an embodiment, a first shortest distance W1 from the first end ED1 to the second end ED2 may be less than a second shortest distance W2 from the third end ED3 to the fourth end ED4 in a plan view. For example, the first shortest distance W1 may be greater than about 0.5 mm and less than about 1 mm. The second shortest distance W2 may be greater than about 1 mm and less than about 2 mm. As the first shortest distance W1 is less than about 1 mm, while the first protective film 200 is removed, the first protective film 200 may not contact the lower structure 2000 in the circuit region CA. Accordingly, components disposed in the circuit region CA may be protected from the first protective film 200. For example, the components may not be tangled with the first protective film 200.

In an embodiment, a third shortest distance W3 from the first end ED1 to the fifth end ED5 may be greater than each of the first and second shortest distances W1 and W2 in a plan view. For example, the third shortest distance W3 may be greater than about 3 mm and less than about 13 mm. As the third shortest distance W3 is set to be sufficiently large, a picker of a process facility during a transportation process of the window module 100 or during a manufacturing process of the display device 3000 may grab or hold the second protective film 300.

Figure 4:
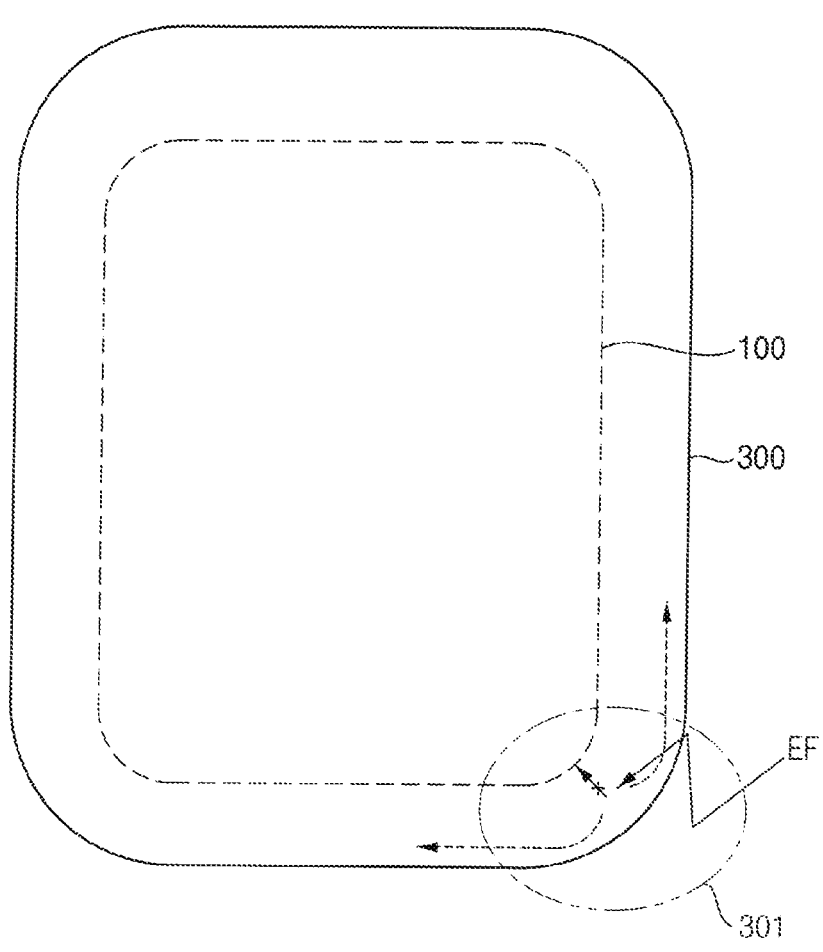
FIG. 4 is a plan view schematically illustrating a second protective film included in the window module of FIG. 1.

FIG. 4 is a schematic plan view illustrating a second protective film included in the window module of FIG. 1.

Referring to FIG. 4, the second protective film 300 may have a rectangular shape with rounded corners 301. For example, the second protective film 300 may be processed so that the corner 301 has a curvature. In an embodiment, a radius of curvature of the corner 301 may be greater than about 2 mm and less than about 10 mm. As the second protective film 300 has a rectangular shape with rounded corners 301, an external force EF applied to the second protective film 300 may be dispersed. Accordingly, the external force EF may not be applied to the window 100, and the window 100 may be protected.

FIGS. 5 to 9 are schematic cross-sectional views illustrating a method of manufacturing a display device according to an embodiment.

Figure 5:
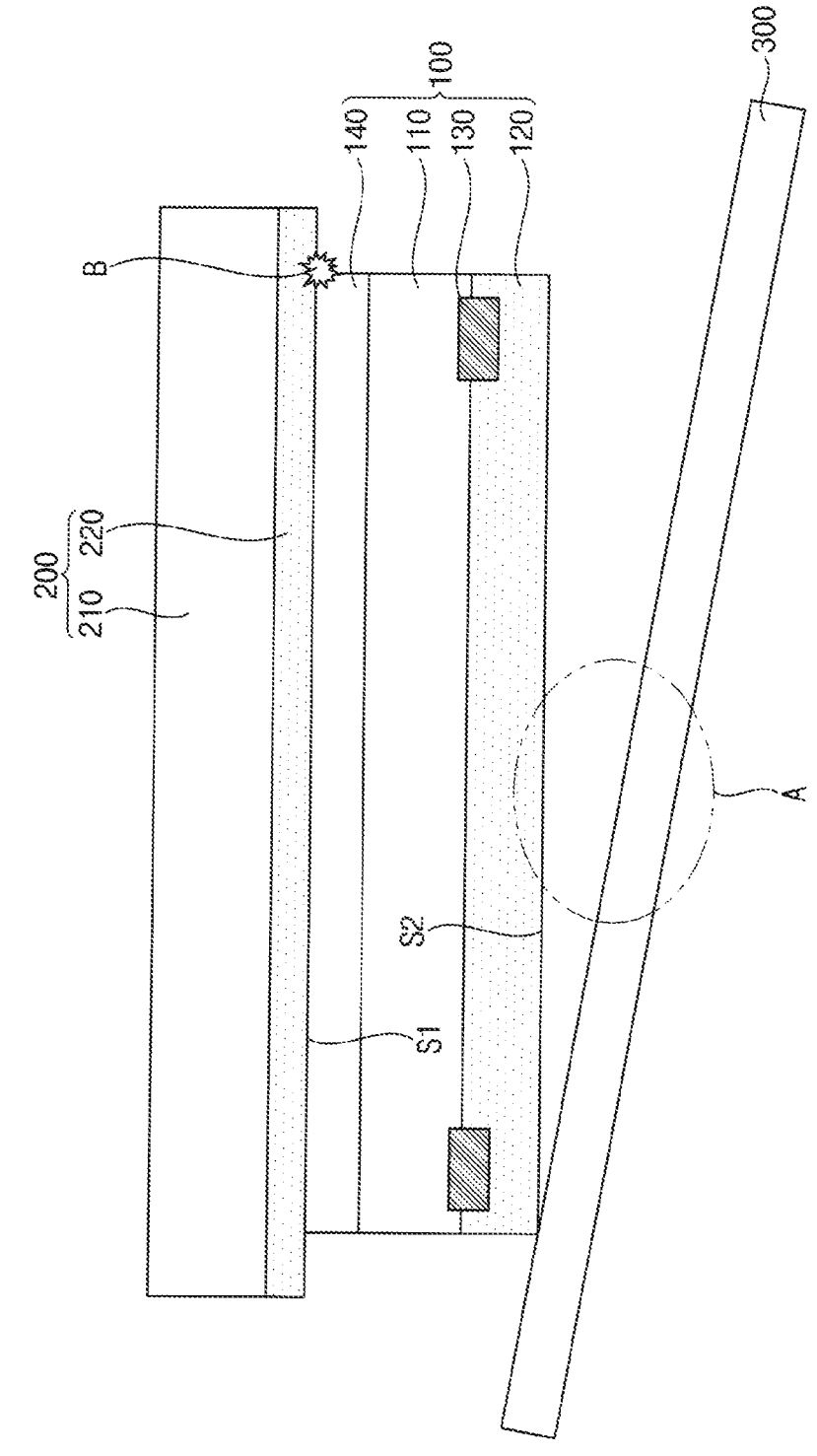
FIG. 5 to FIG. 9 are cross-sectional views schematically illustrating a method of manufacturing a display device according to an example embodiment.

Referring to FIGS. 1 and 5, in a method of manufacturing the display device 3000, the window module 1000 including the window 100, the first protective film 200 disposed on the first surface S1 of the window 100, and the second protective film 300 disposed on the second surface S2 opposite to the first surface S1 of the window 100 may be provided.

The second protective film 300 may be removed from the window 100. In this case, as described above, the second release force of the second protective film 300 with respect to the window 100 may be less than about 6 gf/in. Accordingly, the second protective film 300 may be easily removed from the window 100 in region A. As described above, the second release force may be less than the first release force. Accordingly, while the second protective film 300 is removed from the window 100, bubbles may not be generated in region B.

Figure 6:
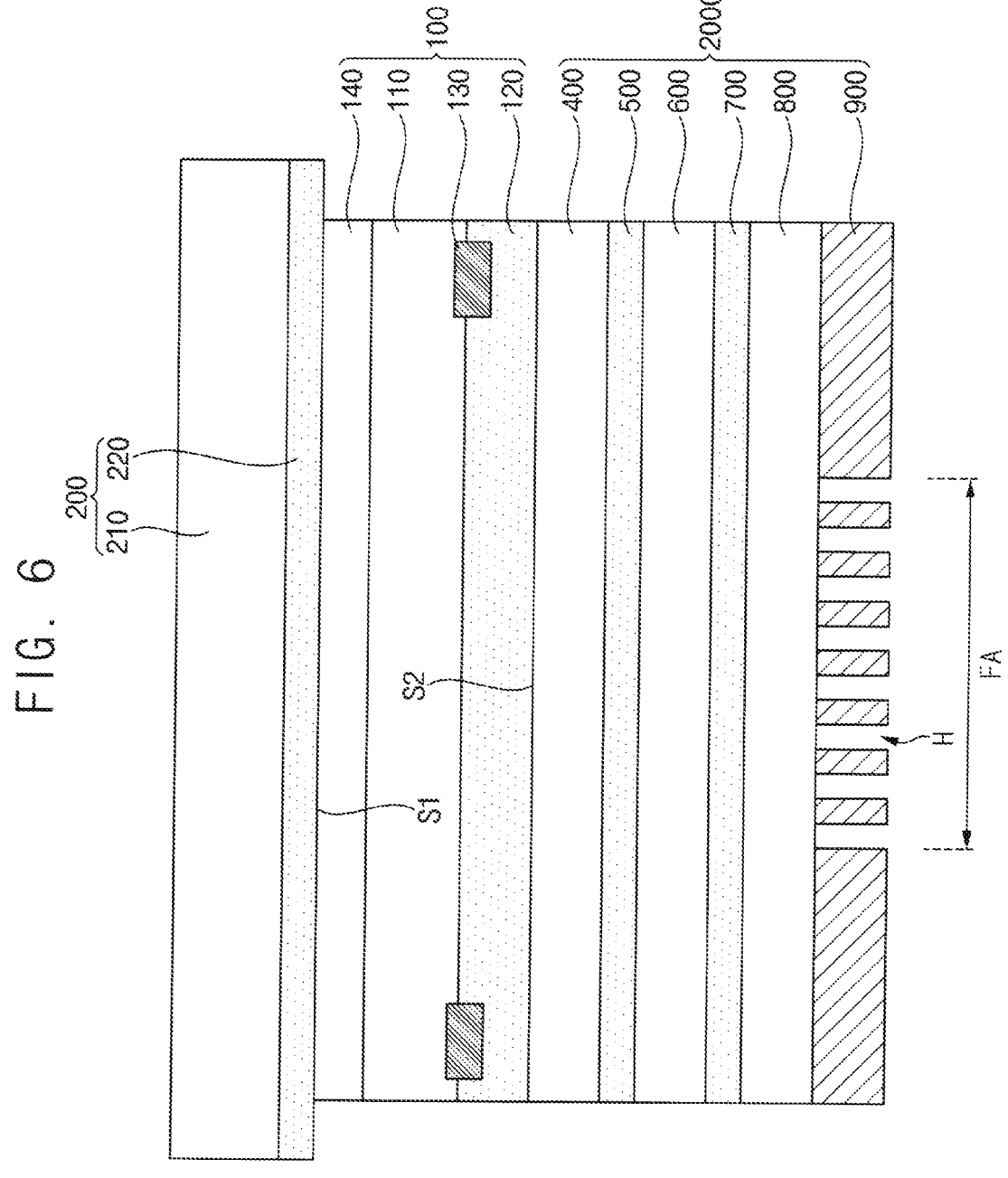
Figure 7:
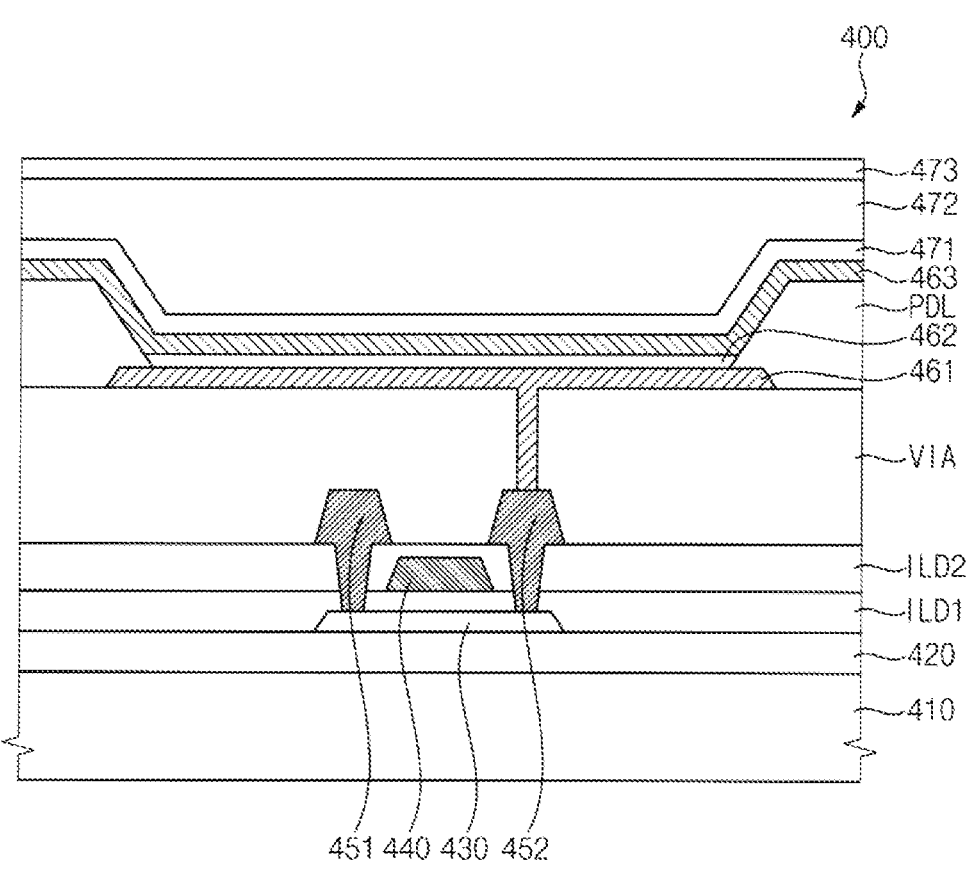

Referring to FIGS. 1, 6 and 7, the lower structure 2000 may be disposed on the second surface S2 of the window 100. The lower structure 2000 may include a display panel 400, a third adhesive layer 500, a third protective film 600, a fourth adhesive layer 700, a buffer member 800, and a support member 900.

As shown in FIG. 7, the display panel 400 may include a substrate 410, a buffer layer 420, an active pattern 430, a first insulating layer ILD1, a gate electrode 440, a second insulating layer ILD2, a source electrode 451, a drain electrode 452, a via insulating layer VIA, a first electrode 461, an emission layer 462, a second electrode 463, a pixel defining layer PDL, a first inorganic layer 471, an organic layer 472, and a second inorganic layer 473.

The substrate 410 may include glass, quartz, plastic, or the like. For example, the substrate 410 may be a plastic substrate and may include polyimide (PI). In an embodiment, the substrate 410 may have a structure in which at least one polyimide layer and at least one barrier layer are alternately stacked.

The buffer layer 420 may be disposed on the substrate 410. The buffer layer 420 may include silicon oxide, silicon nitride, or the like. The buffer layer 420 may prevent impurities from diffusing into the active pattern 430.

The active pattern 430 may be disposed on the buffer layer 420. For example, the active pattern 430 may include a silicon semiconductor, an oxide semiconductor, or the like. The silicon semiconductor may include amorphous silicon or polycrystalline silicon. The active pattern 430 may pass or block a current in response to a gate signal provided to the gate electrode 440. For example, ions may be selectively implanted into the active pattern 430. The active pattern 430 may include a source region and a drain region into which the ions are implanted, and a channel region into which the ions are not implanted.

The first insulating layer ILD1 may include an insulating material and may cover the active pattern 430. For example, the first insulating layer ILD1 may include silicon oxide, silicon nitride, titanium oxide, tantalum oxide, or the like. The first insulating layer ILD1 may electrically insulate the active pattern 430 from the gate electrode 440.

The gate electrode 440 may include a metal, an alloy, a conductive metal oxide, or the like and may be disposed on the first insulating layer ILD1. For example, the gate electrode 440 is silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The second insulating layer ILD2 may include an insulating material and may cover or overlap the gate electrode 440. For example, the second insulating layer ILD2 may include silicon oxide, silicon nitride, titanium oxide, tantalum oxide, or the like. The second insulating layer ILD2 may electrically insulate the gate electrode 440 from the source electrode 451 and electrically insulate the gate electrode 440 from the drain electrode 452.

The source electrode 451 and the drain electrode 452 may include a metal, an alloy, a conductive metal oxide, or the like and may be disposed on the second insulating layer ILD2. For example, the source and drain electrodes 451 and 452 may include silver (Ag), an alloy containing silver, molybdenum (Mo), an alloy containing molybdenum, aluminum (Al), alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

The via insulating layer VIA may cover or overlap the source and drain electrodes 451 and 452, may include an organic insulating material, and may have a substantially flat top surface. For example, the via insulating layer VIA may include a photoresist, a polyacrylic resin, a polyimide resin, an acrylic resin, or the like.

The first electrode 461 may be disposed on the via insulating layer VIA. The first electrode 461 may include a metal, an alloy, or a conductive metal oxide. For example, the first electrode 461 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. The first electrode 461 may receive a first voltage from the drain electrode 452.

The pixel defining layer PDL may be disposed on the via insulating layer VIA, and an opening exposing an upper surface of the first electrode 461 may be formed in the pixel defining layer PDL. For example, the pixel defining layer PDL may include an organic material such as a polyimide resin (e.g., photosensitive polyimide resin (PSPI)), a photoresist, a polyacrylic resin, and an acrylic resin or an inorganic material such as silicon oxide and silicon nitride.

The emission layer 462 may be disposed on the first electrode 461. The emission layer 462 may have a multilayer structure including an organic emission layer, a hole injection layer, a hole transport layer, an electron transport layer, and an electron injection layer.

The second electrode 463 may be disposed on the emission layer 462 and may receive a second voltage. The second electrode 463 may include a metal, an alloy, a conductive metal oxide, or the like. For example, the second electrode 463 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like.

A voltage difference between the first voltage and the second voltage may cause the emission layer 462 to generate light. Accordingly, the first electrode 461, the emission layer 462, and the second electrode 463 may be defined as an organic light emitting diode.

A thin film encapsulation layer may be disposed on the second electrode 463. The thin film encapsulation layer may prevent penetration of moisture and oxygen from the outside. For example, the thin film encapsulation layer may have a structure in which the first inorganic layer 471, the organic layer 472, and the second inorganic layer 473 are alternately stacked.

Referring again to FIG. 6, the third adhesive layer 500 may be disposed under the display panel 400. For example, the third adhesive layer 500 may be an optically transparent adhesive (OCA), an optically transparent adhesive resin (OCR), a pressure sensitive adhesive (PSA), or the like.

The protective film 600 may be disposed under the third adhesive layer 500. The protective film 600 may prevent penetration of moisture and oxygen from the outside and may absorb external shocks.

The fourth adhesive layer 700 may be disposed under the protective film 600. For example, the fourth adhesive layer 700 may be an optically transparent adhesive (OCA), an optically transparent adhesive resin (OCR), a pressure sensitive adhesive (PSA), or the like.

The buffer member 800 may be disposed under the fourth adhesive layer 700. The buffer member 800 may protect the display panel 400 by buffering or absorbing an external impact. For example, the buffer member 800 may include a material, such as a cushion or sponge, capable of buffering or absorbing impacts by containing air. The buffer member 800 may include an acrylic resin, polyurethane, thermoplastic polyurethane, latex, polyurethane foam, polystyrene foam, or the like.

The support member 900 may be disposed under the buffer member 800. The support member 900 may support the display panel 400. For example, the support member 900 may include invar, which is an alloy of nickel (Ni) and iron (Fe), stainless steel (SUS), titanium (Ti), copper (Cu), or the like. Holes H overlapping a folding region FA in which the window 100 and the lower structure 2000 are folded may be formed in the support member 900.

Figure 8:
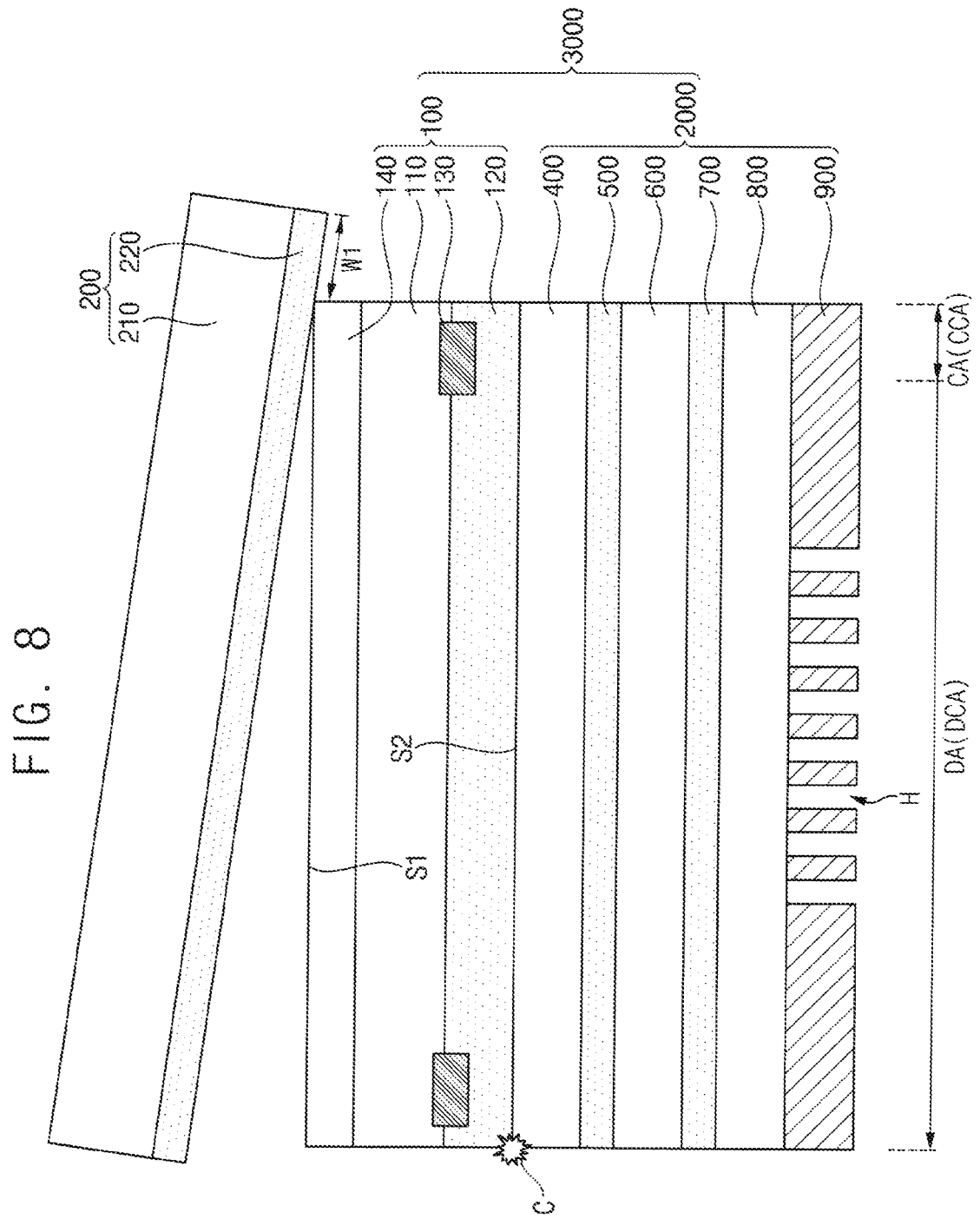

Referring to FIGS. 1 and 8, the first protective film 200 may be removed from the window 100. In this case, as described above, the first release force of the first protective film 200 with respect to the window 100 may be less than about 30 gf/in. Accordingly, while the first protective film 200 is removed from the window 100, bubbles may not be generated in region C between the lower structure 2000 and the window 100. As described above, as the first shortest distance W1 from the first end ED1 to the second end ED2 is less than about 1 mm, the first protective film 200 may not contact the lower structure 2000 in the circuit region CA. Accordingly, components disposed in the circuit region CA may be protected from the first protective film 200. For example, the components may not be tangled with the first protective film 200.

Figure 9:
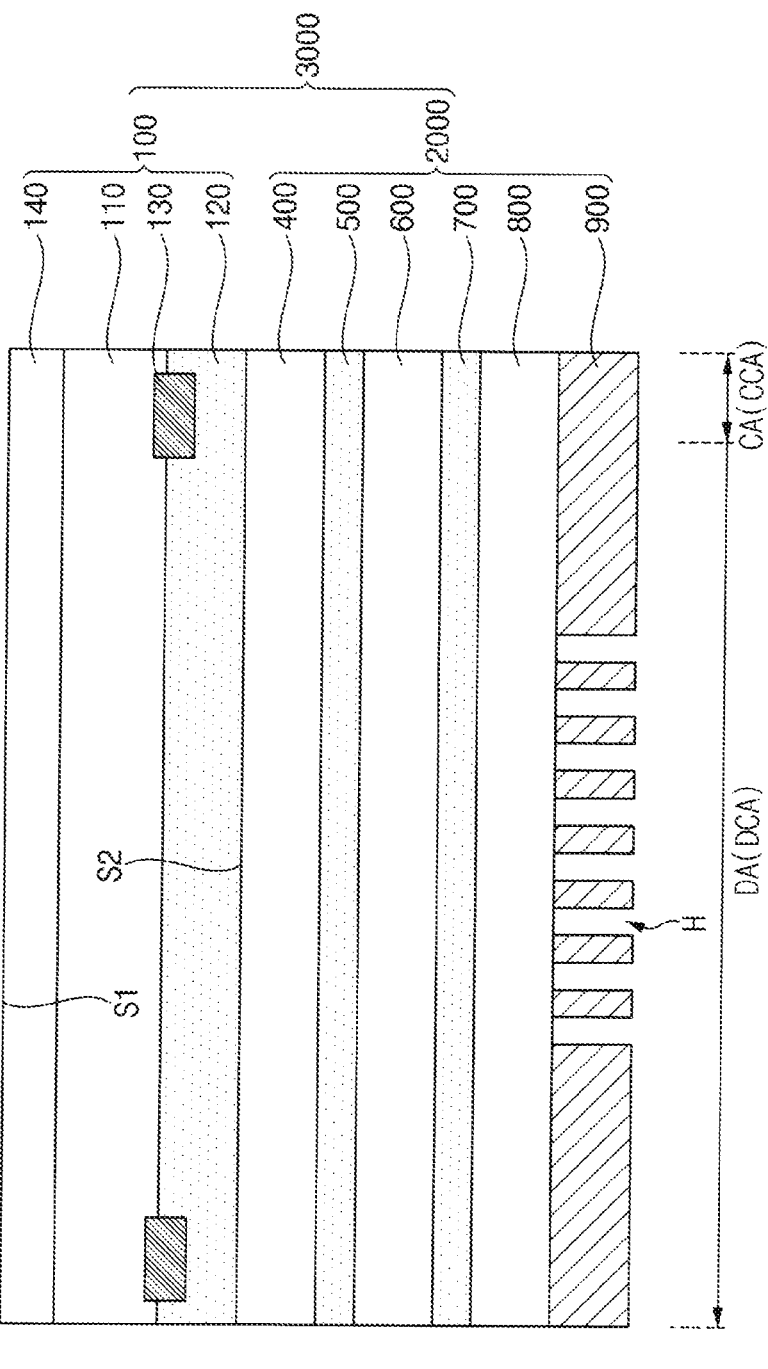

Referring to FIGS. 1 and 9, the display device 3000 may be manufactured. For example, the display device 3000 may include the window 100 and the lower structure 2000.

The window module according to embodiments of the disclosure may include a window, a first protective film disposed on the window, and a second protective film disposed under the window. A first release force of the first protective film with respect to the window may be greater than a second release force of the second protective film with respect to the window. A first shortest distance from an end of the window to the first protective film may be less than a second shortest distance from the other end of the window to the first protective film in a plan view. A first thickness of the first protective film may be greater than a second thickness of the second protective film. The second protective film may have a rectangular shape with rounded corners. Accordingly, bubbles may not be generated while the first and second protective films are removed from the window, the second protective film may be easily removed from the window, defects in which a surface of a first film included in the window is pressed by foreign substances may be prevented, the first protective film may not contact the lower structure in the circuit region, and an external force applied to the second protective film may be dispersed. Accordingly, the window may be stably transported, and a process yield of the display device may be increased.

Although certain embodiments and implementations have been described herein, other embodiments and modifications will be apparent from this description. Therefore, the disclosure is not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:

preparing a window module comprising:

a window comprising a first film and a first adhesive layer, wherein the first adhesive layer completely covers a top surface of the first film, a first protective film comprising a second film and a second adhesive layer on a top surface of the first film of the window, and a second protective film on the first adhesive layer of the window, separating the second protective film from the first adhesive layer of the window;

arranging a lower structure on the first adhesive layer of the window, and separating the first protective film comprising the second film and the second adhesive layer from the window, wherein a first release force of the second adhesive layer of the first protective film with respect to the window is greater than a second release force of the second protective film with respect to the first adhesive layer of the window.

2. The method of claim 1, wherein the first release force is greater than about 10 gf/in and less than about 30 gf/in, and the second release force is greater than about 1 gf/in and less than about 6 gf/in.

3. The method of claim 1, wherein the first protective film extends beyond outer edges of the window in plan view.

4. The method of claim 3, wherein the second protective film extends beyond outer edges of the window in plan view.

5. The method of claim 4, wherein the second protective film extends beyond outer edges of the first protective film.

6. The method of claim 4, wherein the second protective film is separated before the first protective film is separated, and the first protective film is separated after the arranging of the lower structure.

7. The method of claim 4, further comprising laminating the first and second protective films onto the window such that a first shortest distance from a first end of the window to a first end of the first protective film is less than a second shortest distance from a second end of the window to a second end of the first protective film in plan view.

8. The method of claim 4, comprising forming a light blocking pattern between the first film and the first adhesive layer, wherein the light blocking pattern surrounds an outer portion of the first film and is spaced apart from an edge of the first film by a certain distance, and wherein an upper surface of the first adhesive layer is laminated flat to the first film.

\* \* \* \* \*